United States Patent [19]
Fujiwara et al.

[11] Patent Number: 5,689,254
[45] Date of Patent: Nov. 18, 1997

[54] DECODING CIRCUIT FOR RUNLENGTH CODES

[75] Inventors: Mikio Fujiwara, Kyoto; Yoshiyuki Goi; Hideki Ishii, both of Osaka, all of Japan

[73] Assignee: Matsushita Electric Industrial Co., Ltd., Osaka, Japan

[21] Appl. No.: 540,763

[22] Filed: Oct. 11, 1995

[30] Foreign Application Priority Data

Oct. 12, 1994 [JP] Japan .................................. 6-246014

[51] Int. Cl.⁶ ...................................................... H04N 1/41
[52] U.S. Cl. ............................................ 341/59; 358/261.1
[58] Field of Search ................................ 341/63, 67, 59, 341/106; 358/261.1

[56] References Cited

U.S. PATENT DOCUMENTS 5,369,045 11/1994 Choi et al. ................................ 341/63

FOREIGN PATENT DOCUMENTS 2 260 458 10/1991 United Kingdom.

OTHER PUBLICATIONS

ISO/IEC Committee Draft 13818–2, Information Technology—Generic Coding of of Moving Pictures and Associated Audio, Nov., 1993, pp. 57–64.

Primary Examiner—Jeffrey A. Gaffin
Assistant Examiner—Peguy JeanPierre
Attorney, Agent, or Firm—McDermott, Will & Emery

[57] ABSTRACT

After all the data words stored in a first scan transform RAM are initialized to "0"s, only signed level data words are overwritten, based on zero runlength data words, on "0"s at the positions designated by zigzag scan addresses in the first scan transform RAM. Thus, while only non-zero components out of 8×8 components forming one block are written in the first scan transform RAM, a block stored in a second scan transform RAM is read and initialized. Further, while only non-zero components of the next block are written in the second scan transform RAM, the block stored in the first scan transform RAM is read and initialized. This achieves, in real time, highly efficient runlength decoding responsive to a picture element clock signal of high frequency.

3 Claims, 7 Drawing Sheets

| INPUT | | OUTPUT | | | | | |
|---|---|---|---|---|---|---|---|
| 151.1 | 151.0 | 154a | 154b | 154c | 155a | 155b | 155c |
| L(0) | L(0) | H | L | L | H | L | H |
| L(0) | H(1) | L | H | L | H | H | L |
| H(1) | L(0) | L | L | H | L | H | H |

|   | 0 | 1 | 2 | 3 | 4 | 5 | 6 | 7 u |
|---|---|---|---|---|---|---|---|---|
| 0 | 29 | 0 | 0 | 1 | 0 | 1 | -1 | 0 |
| 1 | 2 | 0 | 0 | 0 | 0 | -1 | 0 | 0 |
| 2 | 0 | 1 | -1 | 0 | 0 | 0 | 0 | 0 |
| 3 | 1 | 0 | 0 | 0 | 1 | 0 | 0 | -1 |
| 4 | 1 | -1 | -1 | 1 | 0 | 1 | 0 | 0 |
| 5 | -1 | 1 | 0 | 1 | 0 | 1 | 0 | 0 |
| 6 | 0 | 1 | 0 | 1 | 0 | 0 | 0 | 0 |
| v 7 | 0 | 0 | 0 | 0 | 0 | 0 | 0 | 0 |

FIG.6
PRIOR ART

|   | 0 | 1 | 2 | 3 | 4 | 5 | 6 | 7 u |
|---|---|---|---|---|---|---|---|---|
| 0 | 0 | 1 | 5 | 6 | 14 | 15 | 27 | 28 |
| 1 | 2 | 4 | 7 | 13 | 16 | 26 | 29 | 42 |
| 2 | 3 | 8 | 12 | 17 | 25 | 30 | 41 | 43 |
| 3 | 9 | 11 | 18 | 24 | 31 | 40 | 44 | 53 |
| 4 | 10 | 19 | 23 | 32 | 39 | 45 | 52 | 54 |
| 5 | 20 | 22 | 33 | 38 | 46 | 51 | 55 | 60 |
| 6 | 21 | 34 | 37 | 47 | 50 | 56 | 59 | 61 |
| v 7 | 35 | 36 | 48 | 49 | 57 | 58 | 62 | 63 |

FIG.7
PRIOR ART

| NO. | ZERO RUNLENGTH | NON-ZERO COMPONENT | REMARKS |
|---|---|---|---|
| 0 |  | 29 | DC |
| 1 | 1 | 2 | AC |
| 2 | 3 | 1 |  |
| 3 | 1 | 1 |  |
| 4 | 0 | 1 |  |
| 5 | 0 | 1 |  |
| 6 | 1 | −1 |  |
| 7 | 2 | 1 |  |
| 8 | 3 | −1 |  |
| 9 | 0 | −1 |  |
| 10 | 1 | 1 |  |
| 11 | 0 | −1 |  |
| 12 | 2 | −1 |  |
| 13 | 0 | −1 |  |
| 14 | 3 | 1 |  |
| 15 | 0 | 1 |  |
| 16 | 1 | 1 |  |
| 17 | 3 | 1 |  |
| 18 | 6 | 1 |  |
| 19 | 1 | 1 |  |
| 20 | 3 | 1 |  |
| 21 | 1 | −1 |  |
| 22 | END OF BLOCK |  |  |

FIG.8
PRIOR ART

| LINEAR (DECIMAL) | ZIGZAG SCAN (BINARY) | LINEAR (DECIMAL) | ZIGZAG SCAN (BINARY) |
|---|---|---|---|
| 0 | 000 000 | 32 | 100 011 |
| 1 | 000 001 | 33 | 101 010 |
| 2 | 001 000 | 34 | 110 001 |
| 3 | 010 000 | 35 | 111 000 |
| 4 | 001 001 | 36 | 111 001 |
| 5 | 000 010 | 37 | 110 010 |
| 6 | 000 011 | 38 | 101 011 |
| 7 | 001 010 | 39 | 100 100 |
| 8 | 010 001 | 40 | 011 101 |
| 9 | 011 000 | 41 | 010 110 |
| 10 | 100 000 | 42 | 001 111 |
| 11 | 011 001 | 43 | 010 111 |
| 12 | 010 010 | 44 | 011 110 |
| 13 | 001 011 | 45 | 100 101 |
| 14 | 000 100 | 46 | 101 100 |
| 15 | 000 101 | 47 | 110 011 |
| 16 | 001 100 | 48 | 111 010 |
| 17 | 010 011 | 49 | 111 011 |
| 18 | 011 010 | 50 | 110 100 |
| 19 | 100 001 | 51 | 101 101 |
| 20 | 101 000 | 52 | 100 110 |
| 21 | 110 000 | 53 | 011 111 |
| 22 | 101 001 | 54 | 100 111 |
| 23 | 100 010 | 55 | 101 110 |
| 24 | 011 011 | 56 | 110 101 |
| 25 | 010 100 | 57 | 111 100 |
| 26 | 001 101 | 58 | 111 101 |
| 27 | 000 110 | 59 | 110 110 |
| 28 | 000 111 | 60 | 101 111 |
| 29 | 001 110 | 61 | 110 111 |
| 30 | 010 101 | 62 | 111 110 |
| 31 | 011 100 | 63 | 111 111 |

DECODING CIRCUIT FOR RUNLENGTH CODES

BACKGROUND OF THE INVENTION

The present invention relates to a decoding circuit for runlength codes.

As an international standard relating to the compression and expansion of moving picture data, there is known MPEG2 (Moving Picture Image Coding Experts Group Phase 2) generally called after the name of an ISO/IEC working group. According to the MPEG2, a moving picture is divided into blocks each having a size of 8×8 picture elements or into macro blocks each having a size of 16×16 picture elements, and a data processing is executed per block or per macro block.

An image coder for the compression of moving picture according to the MPEG2 mainly comprises a DCT (Discrete Cosine Transform) circuit, a quantiser, an RLC (Run Length Coder), and a VLC (Variable Length Coder). The DCT circuit is arranged to transform spatial domain data into frequency domain data per block. The purpose of such a transform is that, using the nature that a major portion of energy is gathered in a low frequency domain in a natural picture, coefficients each having a relatively great non-zero value are unevenly distributed in the low frequency domain. In the quantiser, with the use of the fact that the sight sensibility of a human being is lower with respect to a high frequency domain than with respect to the low frequency domain, coefficients in the high frequency domain out of the results of the DCT circuit are more coarsely quantised. Accordingly, there are transformed, into zero components, almost all of the coefficients each of which has a small value in the high frequency domain. The RLC is arranged to scan the results of the quantiser in zigzag such that the zero components readily range in a line, thereby to generate a data stream having a plurality of data sets each comprising: a zero runlength data word representing the number of the zero components preceding a non-zero component; and a level data word representing the value of the non-zero component. Using a Huffman code table, such a runlength-coded data stream is variable-length coded by the VLC.

Figure 5:
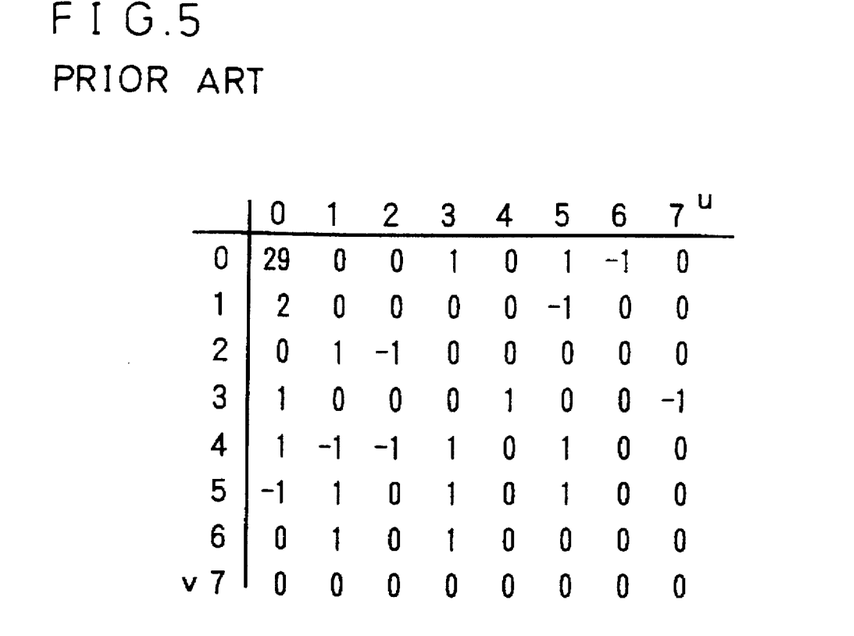
FIG. 5 shows an example of the components of a block immediately after quantisation.
Figure 6:
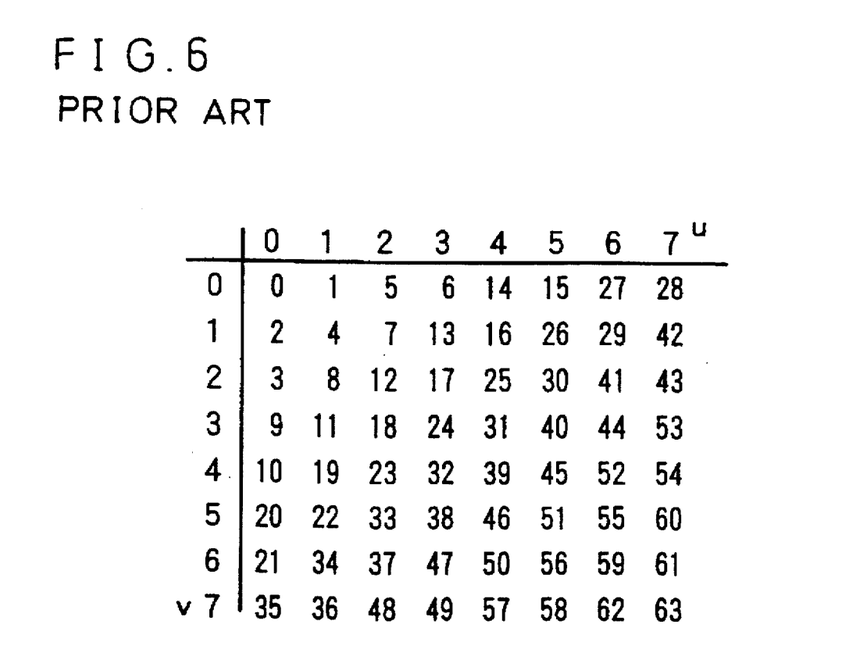
FIG. 6 shows an example of the rule relating to a zigzag scan order.
Figure 7:
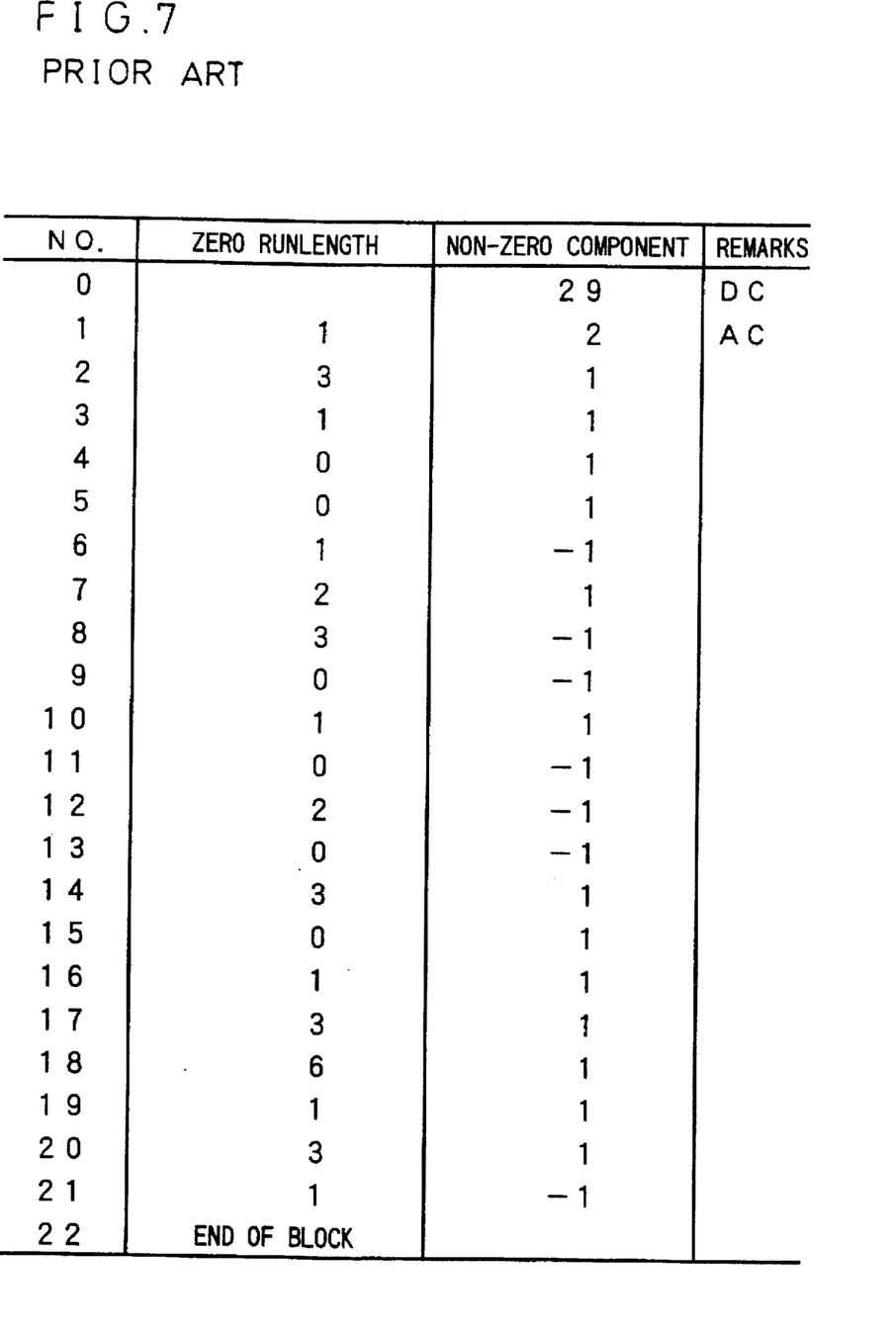
FIG. 7 shows an example of a runlength-coded data stream.

A data processing by the RLC in the image coder above-mentioned will be discussed with reference to an example shown in FIGS. 5 to 7. FIG. 5 shows an example of 8×8 components QF[v][u] (0≦v≦7, 0≦u≦7) forming one block immediately after quantisation. According to the rule of the zigzag scan order shown in FIG. 6, 8×8 components in FIG. 5 are scanned to successively obtain pairs of zero runlength data words and level data words (data words relating to non-zero components). Reference numerals 1 to 21 in FIG. 7 represent 21 pairs of data words thus obtained and correspond to 63 AC (alternating current) coefficients out of the results of the DCT circuit. The data word corresponding to a DC (direct current) coefficient at the position of v=0 and u=0, is shown at the code No. 0, while an EOB (End of Block) code is shown at the code No. 22. The EOB code shows that any non-zero component does not exist more in the results of the quantiser after the EOB code. In FIGS. 5 to 7, 8×8 components forming one block in the results of the quantiser are compressed, in the results of the RLD, into one data word corresponding to the DC coefficient, 21 pairs of data words corresponding to the AC coefficients and the EOB code.

On the other hand, an image decoder for reproducing the original moving picture mainly comprises, as corresponding to the image coder, a VLD (Variable Length Decoder), an RLD (Run Length Decoder), an inverse quantiser, and an IDCT (Inverse Discrete Cosine Transform) circuit.

Figure 4:
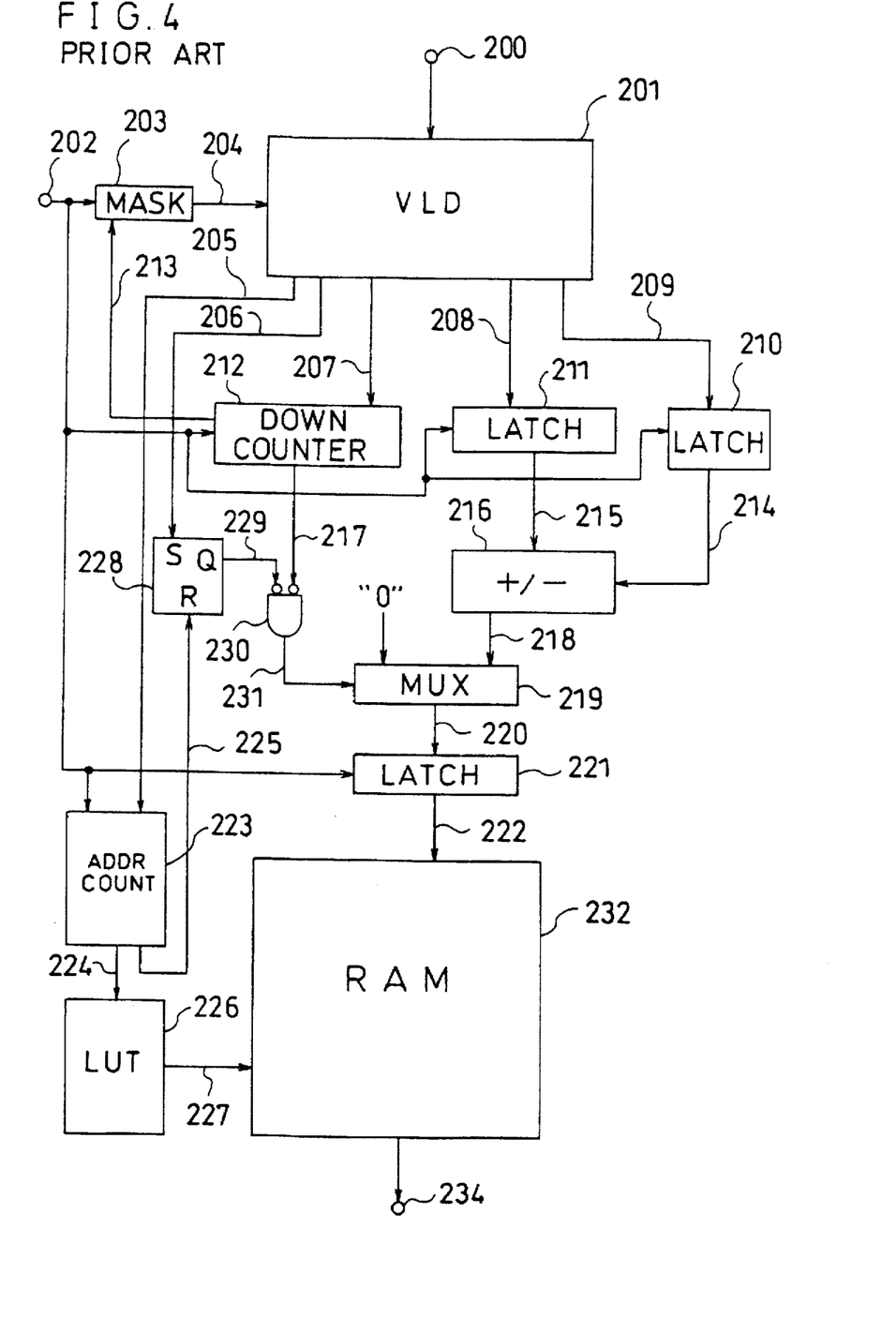
FIG. 4 is a block diagram of an example of the arrangement of a conventional decoding circuit.

FIG. 4 shows an example of the arrangement of an RLD circuit of a conventional image decoder, together with a VLD at the preceding stage. The decoding circuit in FIG. 4 is made in a pipeline arrangement comprising a VLD 201, a 1-bit latch 210, a first data latch 211, a down counter with data preset 212, a second data latch 221, an address counter 223, a lookup table (LUT) 226, and a scan transform RAM (Random Access Memory) 232. The bit lengths of the first data latch 211, the down counter 212 and the second data latch 221 are, for example, 16, 8, 16, respectively. A variable-length coded data stream supplied through a data input terminal 200 is supplied to the VLD 201. To cause the decoding circuit to execute a synchronous operation, a clock signal 202 is distributed to the 1-bit latch 210, the first data latch 211, the down counter 212, the second data latch 221 and the address counter 223, and is also supplied to the VLD 201 through a mask circuit 203 and a signal line 204.

When a variable length code of a DC coefficient is supplied to the data input terminal 200, the VLD 201 supplies, to a signal line 205, a block start signal representing the start of one block. When a variable length code of an AC coefficient is supplied to the data input terminal 200, the VLD 201 supplies; to a signal line 207, a zero runlength data word representing the number of zero components preceding a non-zero component; to a signal line 208, a level data word representing the absolute value of the non-zero component; and to a signal line 209, 1-bit information designating whether the non-zero component is positive or negative. The decoding results relating to the DC coefficient are supplied, as level data, to the signal lines 208, 209. Further, when a variable length code relating to the EOB is supplied to the data input terminal 200, the VLD 201 supplies an EOB detection signal to a signal line 206.

The address counter 223 which has received the block start signal on the signal line 205, counts up, in order, a value from the initial value "0" in synchronism with the clock signal 202, and supplies, as a linear address, the counted value to a signal line 224. When the counted value reaches "63 (in a decimal notation)", the address counter 223 supplies, as a block end signal, a pulse signal representing the end of the block to a signal line 225. At an initial state, an RS flip-flop 228 connected to the VLD 201 and the address counter 223, maintains a signal line 229 at the "L" level. Upon reception of the EOB detection signal on the signal line 208, the RS flip-flop 228 sets the signal line 229 to the "H" level. Upon reception of the block end signal on the signal line 225, the RS flip-flop 228 resets the signal line 229 to the "L" level.

Figure 8:
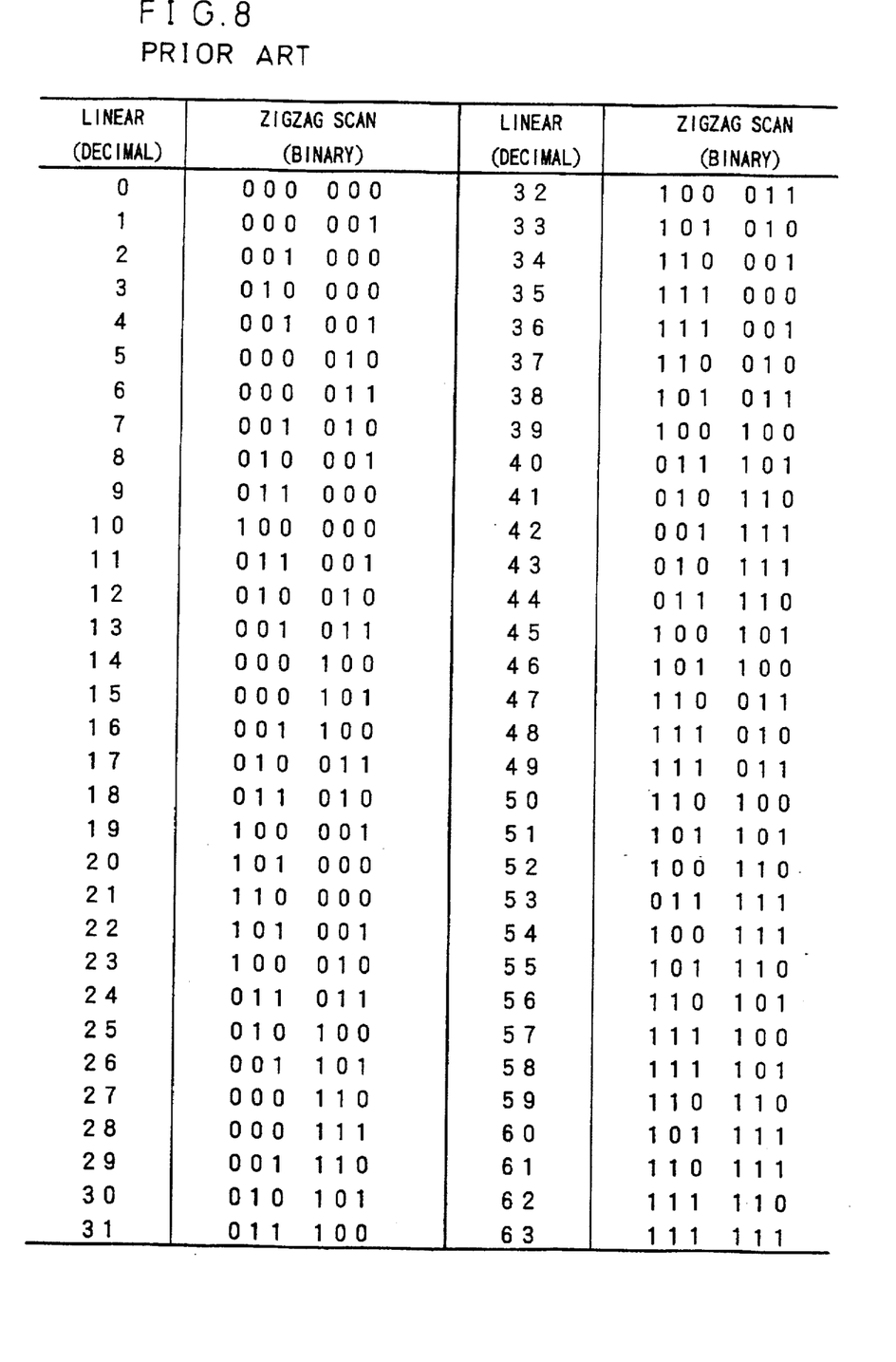
FIG. 8 shows an example of an address transform table corresponding to FIG. 6.

The lookup table 226 has an address transform table, shown in FIG. 8, corresponding to the zigzag scan in FIG. 6. The linear address on the signal line 224 is transformed into the corresponding zigzag scan address, which is then supplied to a signal line 227. The zigzag scan address on the signal line 227 is given, as a writing address, to the scan transform RAM 282.

In synchronism with the clock signal 202, the zero runlength data word on the signal line 207, the level data word on the signal line 208 and the 1-bit information on the signal line 209 are respectively latched by the down counter 212, the first data latch 211 and the 1-bit latch 210. In synchronism with the clock signal 202, the down counter 212 decreases a preset zero runlength data word down to "0". During this counting operation, a signal line 218 of the down counter 212 is fixed to the "H" level. As a result, the mask circuit 203 prevents the clock signal 202 from being propagated to the VLD 201. The VLD 201 does not change the signal lines 207, 208, 209 in state. On the other hand, the level data word latched by the first data latch 211 and the 1-bit information latched by the 1-bit latch 210 are supplied to a positive/negative value changeover unit 216 through a signal line 215 and a signal line 214, respectively. It is now supposed that the level data word on the signal line 215 is referred to LEVEL(n) and the 1-bit information on the signal line 214 is referred to S(n) (n=0 to 21 in the example in FIG. 7). In this case, the positive/negative value changeover unit 216 calculates a signed level data word SLEVEL(n) according to the following equations, and supplies the signed level data word to a signal line 218:

If S(n)=0 then SLEVEL(n)=LEVEL(n)    (1)

If S(n)=1 then SLEVEL(n)=(−LEVEL(n))    (2)

During the counting operation of the down counter 212, another signal line 217 of the down counter 212 is also fixed to the "H" level. Accordingly, a NOR circuit 230 for receiving two inputs of the signals on the two signal lines 217, 229, fixes a selection signal on a signal line 231 to the "H" level. A multiplexer (MUX) 219 which has received the selection signal in the "H" level on the signal line 281, supplies a fixed data word "0" to a signal line 220. When the counted value of the down counter 212 becomes "0", each of the signal lines 213, 217 is brought to the "L" level. As a result, the VLD 201 supplies decoding results of a next variable length code to the signal lines 207, 208, 209, and the multiplexer 219 supplies the signed level data word on the signal line 218 to the signal line 220. When a variable length code relating to the EOB is supplied to the data input terminal 200, the VLD 201 supplies an EOB detection signal to the RS flip-flop 228 as mentioned earlier. Thus, the multiplexer 219 starts supplying again the fixed data word "0" to the signal line 220. The fixed data word "0" and the signed level data word thus supplied to the signal line 220, are latched by the second data latch 221 in synchronism with the clock signal 202. The data word latched by the second data latch 221, is given, as a writing data, to the scan transform RAM 282 through a signal line 222. As a result, a series of data words are successively written to the positions designated by the zigzag scan addresses on the signal line 227 in the scan transform RAM 282, and one block formed by 8×8 components as shown in FIG. 5 is restored in the scan transform RAM 282. The 8×8 components in the scan transform RAM 282 are successively supplied by reading means (not shown) to an inverse quantiser at the next stage through a data output terminal 234.

As thus discussed, the conventional RLD requires $8^2$ clock pulses in the clock signal 202 for one block processing, regardless of the number of the non-zero components out of the 8×8 components forming one block.

On the other hand, a macro block in size of 16×16 picture elements of a color moving picture is composed, according to a so-called 4:2:0 format, of total six blocks including four blocks relating to a luminance signal Y and two blocks relating to chrominance signals Cb, Cr. Each block is composed of 8×8 data elements. More specifically, the conventional RLD above-mentioned requires $6\times8^2$ clock pulses of the clock signal 202 for runlength-decoding $6\times8^2$ components representing a macroblock having a size of $4\times8^2$ picture elements. It is therefore required that the frequency of the clock signal 202 is not less than 1.5 time the frequency of a picture element clock signal.

This means that no particular problem is encountered when the frequency of a picture element clock signal is about 13.5 MHz as in the main profile at main level, corresponding to the resolution of a current television system, out of the eleven specifications in the MPEG2. This is because there can readily be prepared a system clock signal having about quadruple frequency or 54 MHz with other conditions also taken into consideration.

However, in the main profile at high 1440 level or the main profile at high level in the MPEG2, corresponding to a HDTV (High Definition Television) system of which resolution is higher than that in the current television system, the frequency of a picture element clock signal is as high as exceeding 40 MHz. It is therefore difficult for the conventional RLD to achieve runlength decoding in real time.

SUMMARY OF THE INVENTION

It is an object of the present invention to provide a highly efficient runlength decoding circuit which can cope in real time with picture element clock signals of high frequency.

To achieve the object above-mentioned, the present invention is arranged such that all the data words stored in a scan transform RAM are previously initialized to "0", and that only the level data word is written based on a zero runlength data word in the scan transform RAM at its corresponding position such that "0" in the scan transform RAM is overwritten. A writing address for writing a level data word in the scan transform RAM is generated by an adder for calculating a linear address and by a lookup table for transforming the linear address into a zigzag scan address.

In particular, when the scan transform RAM is formed by two dual-port RAMs, provision is made such that, while a level data word is written in one dual-port RAM, data words stored in the other dual-port RAM are read and initialized. In this case, it is convenient to initialize data words immediately after read out.

When the scan transform RAM is formed by three single-port RAMs, provision is made such that, while a level data word is written in one of the three single-port RAMs, there are executed reading data words stored in one of the two remaining single-port RAMs and initializing data words stored in the other of the two remaining RAMs.

DETAILED DESCRIPTION OF THE INVENTION

Figure 1:
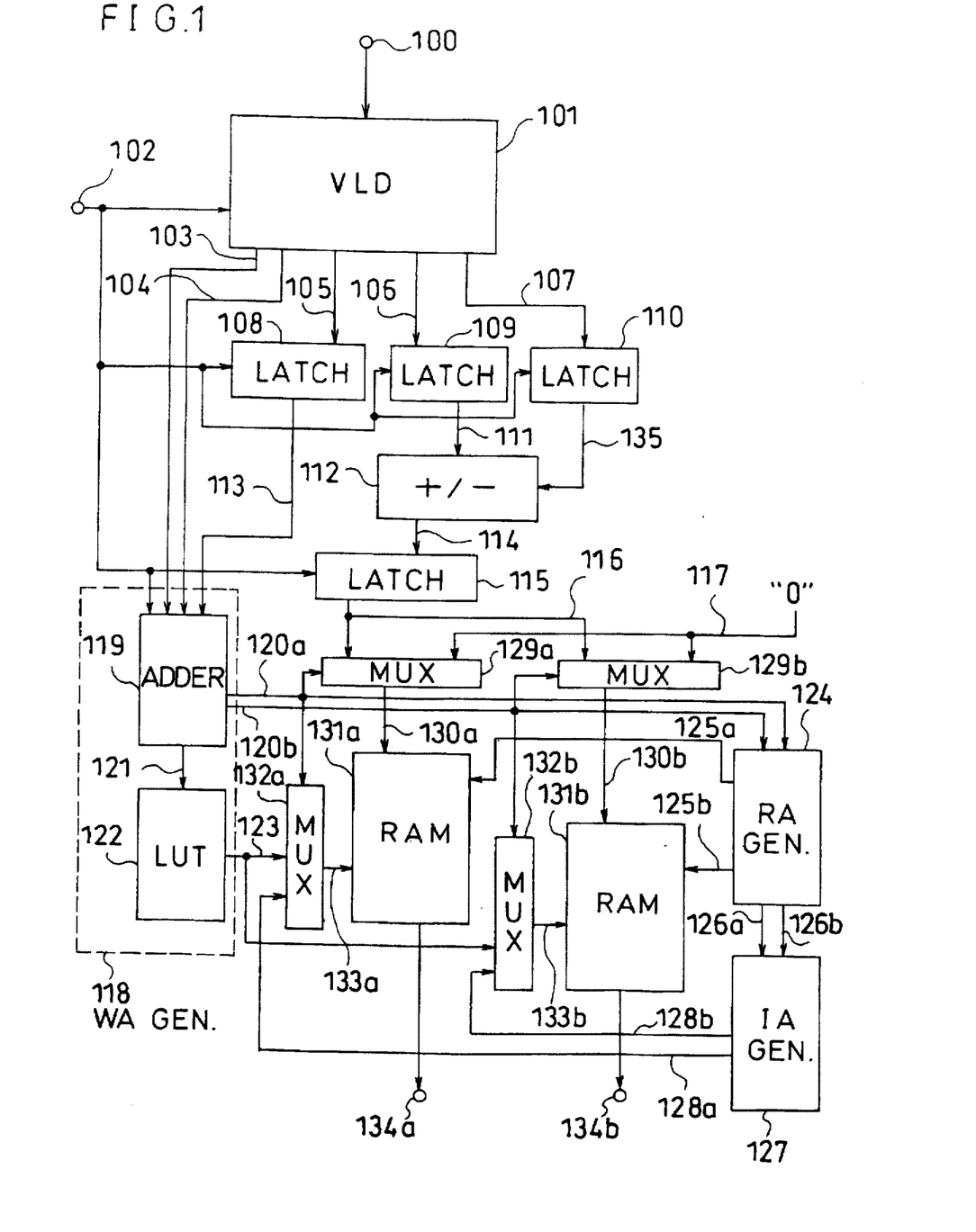
FIG. 1 is a block diagram of an example of the arrangement of a decoding circuit according to the present invention.

FIG. 1 shows an example of the circuit arrangement of an RLD (Run Length Decoder) of the present invention, together with a VLD (Variable Length Decoder) at the preceding stage. The decoding circuit in FIG. 1 is made in a pipeline arrangement comprising a VLD 101, a first data latch 108, a second data latch 109, a 1-bit latch 110, a third data latch 115, an address adder 119, a lookup table 122, a reading address generating circuit 124, an initializing address generating circuit 127, a first scan transform RAM 131a, and a second scan transform RAM 131b. Each of the first and second scan transform RAMs 131a, 131b is formed by a dual-port RAM. The address adder 119 and the lookup table 122 form a writing address generating circuit 118. The bit lengths of the first data latch 108, the second data latch 109 and the third data latch 115 are, for example, 8, 16, 16, respectively. A variable-length coded data stream supplied through a data input terminal 100, is supplied to the VLD 101. To cause the decoding circuit to execute a synchronous operation, a clock signal 102 is distributed to the first data latch 108, the second data latch 109, the 1-bit latch 110, the third data latch 115, and the address adder 119. Further, the clock signal 102 is directly supplied to the VLD 101.

When a variable length code of a DC coefficient is supplied to the data input terminal 100, the VLD 101 supplies, in synchronism with the clock signal 102, a block start signal representing the start of one block, to a signal line 103. When a variable length code of an AC coefficient is supplied to the data input terminal 100, the VLD 101 supplies; to a signal line 105, a zero runlength data word representing the number of zero components preceding a non-zero component; to a signal line 106, a level data word representing the absolute value of the non-zero component; and, to a signal line 107, 1-bit information for designating whether the non-zero component is positive or negative, these data words and information being supplied in synchronism with the clock signal 102. The decoding results relating to the DC coefficient are supplied, as level data, to the signal lines 106, 107. Further, when a variable length code relating to an EOB is supplied to the data input terminal 100, the VLD 101 supplies, in synchronism with the clock signal 102, an EOB detection signal to a signal line 104.

In synchronism with the clock signal 102, the zero runlength data word on the signal line 105, the level data word on the signal line 106 and the 1-bit information on the signal line 107 are respectively latched by the first data latch 108, the second data latch 109 and the 1-bit latch 110. The zero runlength data word latched by the first data latch 108 is supplied to a signal line 113. The level data word latched by the second data latch 109 and the 1-bit information latched by the 1-bit latch 110 are supplied to a positive/negative value changeover unit 112 through a signal line 111 and a signal line 135, respectively. It is now supposed that the level data word on the signal line 111 is referred to LEVEL(n) and the 1-bit information on the signal line 135 is referred to S(n) (n=0 to 21 in the example in FIG. 7). In this case, the positive/negative value changeover unit 112 calculates a signed level data word SLEVEL(n) according to the equations (1) and (2) mentioned earlier, and supplies the signed level data word to a signal line 114. The signed level data word on the signal line 114 is latched, in synchronism with the clock signal 102, by the third data latch 115. The signed level data word latched by the third data latch 115 is supplied to a signal line 116.

In synchronism with the clock signal 102, the address adder 119 which has received the block start signal on the signal line 103, initializes, to "0", a linear address held by the address adder 119 and supplies this linear address to a signal line 121. It is now supposed that the linear address held by the address adder 119 is referred to LADDER(n−1) and the zero runlength data word on the signal line 113 is referred to RUN(n) (n=1 to 21 in the example in FIG. 7). In this case, the address adder 119 calculates, in synchronism with the clock signal 102, a new linear address LADDER(n) according to the following equation, and holds this new linear address:

$$\text{LADDER}(n)=\text{LADDER}(n-1)+\text{RUN}(n)+1 \tag{3}$$

This new linear address is also supplied to the signal line 121. Further, the address adder 119 has a function of setting one of a first selection signal on a signal line 120a or a second selection signal on a signal line 120b to the "H" level and the other to the "L" level. Upon each reception of the EOB detection signal on the signal line 104, the address adder 119 inverts the logic levels of the first and second selection signals.

The lookup table 122 has an address transform table, shown in FIG. 8, corresponding to the zigzag scan in FIG. 6. Thus, the linear address on the signal line 121 is transformed into a corresponding zigzag scan address, which is then supplied to a signal line 123.

The reading address generating circuit 124 supplies a reading address to a signal line 125b when the first selection signal on the signal line 120a is in the "H" level, and to a signal line 125a when the second selection signal on the signal line 120b is in the "H" level. The reading address on the signal line 125a is given to the first scan transform RAM 131a, and the reading address on the signal line 125b is given to the second scan transform RAM 131b. A data word read from the first scan transform RAM 131a according to the reading address on the signal line 125a, is supplied to a first data output terminal 134a, and a data word read from the second scan transform RAM 131b according to the reading address on the signal line 125b is supplied to a second data output terminal 134b. Further, the same reading address as that on the signal line 125a is supplied to a signal line 126a, and the same reading address as that on the signal line 125b is supplied to a signal line 126b.

When a reading address is supplied to the signal line 126a, the initializing address generating circuit 127 supplies, as an initializing address, the same address as this reading address to a signal line 128a at a slightly delayed timing. When a reading address is supplied to the signal line 126b, the initializing address generating circuit 127 supplies, as an initializing address, the same address as this reading address to a signal line 128b at a slightly delayed timing.

First and second data multiplexers 129a, 129b and first and second address multiplexers 132a, 132b are disposed on the periphery of the first and second scan transform RAMs 131a, 131b. The first data multiplexer 129a supplies, to a signal line 130a, the signed level data word on the signal line 116 when the first selection signal on the signal line 120a is in the "H" level, and a fixed data word "0" on a signal line 117 when the first selection signal is in the "L" level. The data word on the signal line 130a is given as a writing data to the first scan transform RAM 131a. The second data multiplexer 129b supplies, to a signal line 130b, the signed level data word on the signal line 116 when the second selection signal on the signal line 120b is in the "H" level, and the fixed data word "0" on the signal line 117 when the second selection signal is in the "L" level. The data word on the signal line 130b is given, as a writing data, to the second scan transform RAM 131b. The first address multiplexer 132a supplies, to a signal line 133a, the zigzag scan address on the signal line 123 when the first selection signal on the signal line 120a is in the "H" level, and the initializing address on the signal line 128a when the first selection signal is in the "L" level. The address on the signal line 133a is given, as a writing address, to the first scan transform RAM 131a. The second address multiplexer 132b supplies, to a signal line 133b, the zigzag scan address on the signal line 123 when the second selection signal on the signal line 120b is in the "H" level, and the initializing address on the 128b when the second selection signal is in the "L" level. The address on the signal line 133b is given, as a writing address, to the second scan transform RAM 131b.

According to the decoding circuit in FIG. 1, after all the data words stored in the first scan transform RAM 131a have been initialized to "0"s, only the signed level data words are overwritten, according to zero runlength data words, on "0"s at the positions designated by the zigzag scan addresses in the first scan transform RAM 131a. Thus, while only the non-zero components out of 8×8 components forming a block, are written in the first scan transform RAM 131a, there is read and initialized a block stored in the second scan transform RAM 131b.

Further, while only the non-zero components of the next block are written in the second scan transform RAM 131b, there is read and initialized the block stored in the first scan transform RAM 131a.

For example, it is now supposed that, in a mode in which writing data in the first scan transform RAM 131a is executed, a variable length code of an AC coefficient is supplied, subsequent to a variable length code of a DC Coefficient, to the data input terminal 100 such that the VLD 101 generates a zero runlength data word RUN (n) of "3", a level data word LEVEL(n) of "2", and 1-bit information S(n) of "0". In this case, the address adder 119 first supplies a linear address LADDR(n−1) of "0" to the signal line 121, and then supplies, according to the equation (3), a linear address LADDR(n) of "4 (decimal notation)" to the signal line 121. Accordingly, the lookup table 122 supplies, according to the address transform table shown in FIG. 8, a zigzag scan address of "001 001 (binary notation)" next to "000 000 (binary notation)", to the first scan transform RAM 131a. The third data latch 115 supplies, next to a signed level data word SLEVEL(n−1) corresponding to the DC coefficient, a signed level data word SLEVEL(n) of "+2" obtained from the equation (1), to the first scan transform RAM 131a. Accordingly, after "0" at the position designated by the zigzag scan address "000 000" in the first scan transform RAM 131a has been overwritten by the signed level data word SLEVEL(n−1) corresponding to the DC coefficient, "0" at the position designated by the zigzag scan address "001 001" is overwritten by the signed level data word SLEVEL(n) of "+2". Here, "0" at the position designated by the zigzag scan address corresponding to each of the linear addresses "1", "2" and "3", remains as it is in the first scan transform RAM 131a. Similarly, each time a variable length code of an AC coefficient is given to the data input terminal 100, a signed level data word latched by the third data latch 115 is overwritten on "0" at the corresponding position in the first scan transform RAM 131a.

As thus discussed, the decoding circuit in FIG. 1 is arranged such that all the data words stored in the scan transform RAM (e.g., 131a) are previously initialized to "0"s and that only the signed level data words are written, in synchronism with the clock signal 102, in the scan transform RAM. This considerably reduces, according to the number of nonzero components out of 8×8 components forming one block, the number of clock pulses of the clock signal 102 required for processing one block, to less than $8^2$. Accordingly, even for a processing of a macro block (4:2:0 format) having a size of 16×16 picture elements of a color moving picture, there can be used the clock signal 102 having frequency identical with that of a picture element clock signal. More specifically, the decoding circuit in FIG. 1 is arranged such that, even though the frequency of the picture element clock signal is as high as exceeding 40 MHz, the $6 \times 8^2$ components representing the macro block can readily be runlength-decoded in real time with clock pulses in the number less than $4 \times 8^2$ of the clock signal 102.

It is convenient that the data word read on the first data output terminal 134a is supplied to a pair of an inverse quantiser and an IDCT circuit each having a pipeline arrangement and that the data word read on the second data output terminal 134b is supplied to another pair of an inverse quantiser and an IDCT circuit each having a pipeline arrangement. Parallel operations of a plurality of pipelines enable the decoding circuit in FIG. 1 to be effectively utilized.

It is apparent that similar effects can be produced by an arrangement using three or more dual-port RAMs. In the embodiment above-mentioned, each time one data word is read, this data word is initialized to "0". However, provision may be made such that, after reading one block is completed, initializing this block starts. It is noted, however, that before it is complete to write non-zero components out of 8×8 components forming one block, reading and initializing a preceding block have been completed.

The decoding circuit in FIG. 1 may be arranged such that, upon completion of initializing a first block, the initializing address generating circuit 127 supplies a write request signal to the address adder 119, and that, until the address adder 119 receives this write request signal, the address adder 119 waits without inverting the first and second selection signals respectively on the signal lines 120a and 120b and gives a wait signal to the VLD 101, even though the address adder 119 has received the EOB detection signal on the signal line 104. According to this arrangement, writing a third block never starts before reading and initializing the first block and writing a second block are completed. To increase the speed of reading and initializing blocks in the first and second scan transform RAM 131a, 131b, it is effective, for example, to execute the reading and initialization per a plurality of data words.

Figure 2:
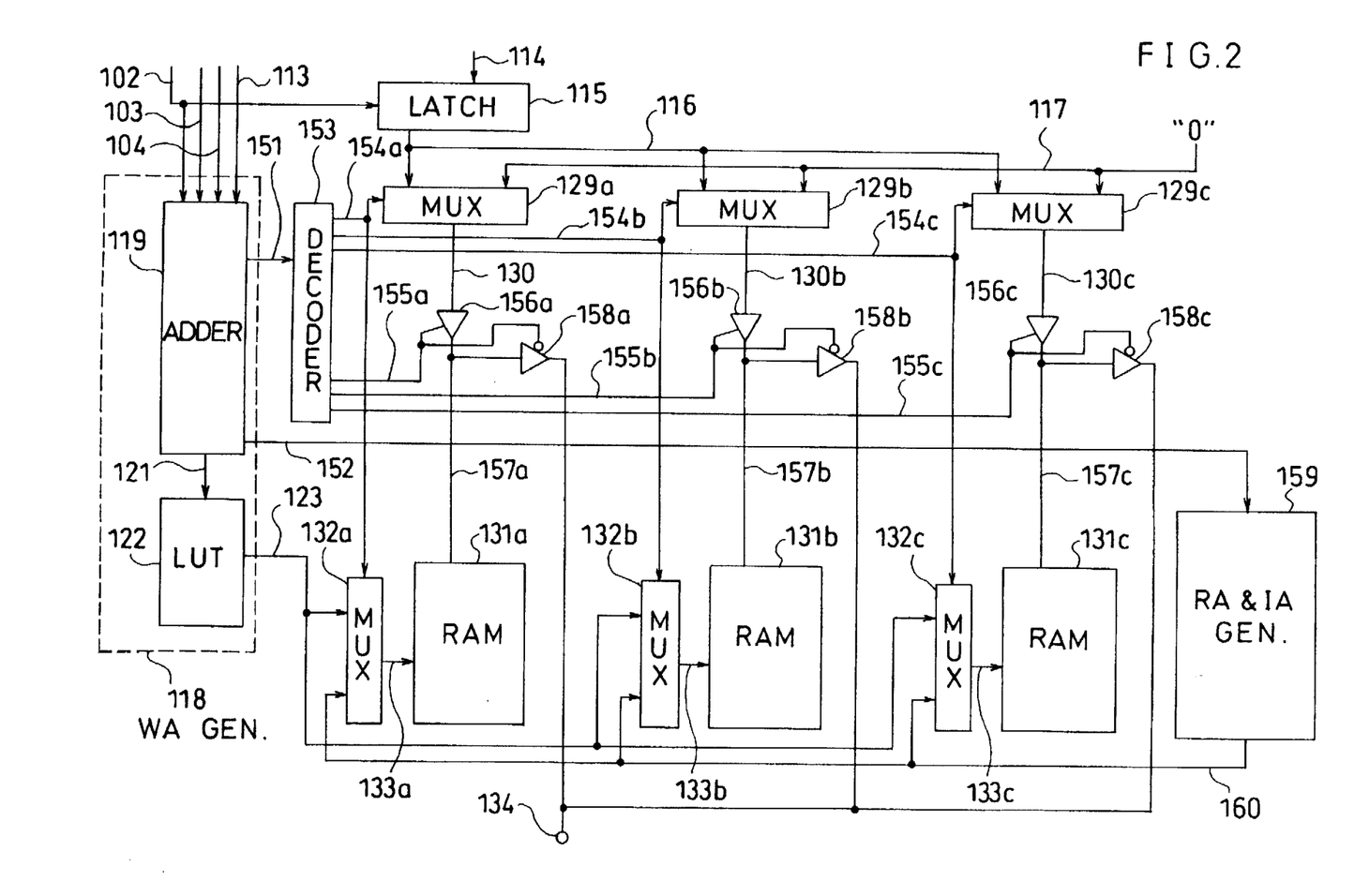
FIG. 2 is a block diagram illustrating a portion of the arrangement of another decoding circuit according to the present invention.

FIG. 2 shows a portion of the arrangement of another decoding circuit according to the present invention having first, second and third scan transform RAMs 131a, 131b, 131c each composed of a single-port RAM. This decoding circuit has circuit blocks respectively similar to the VLD 101, the first data latch 108, the second data latch 109, the 1-bit latch 110, the positive/negative value changeover unit 112, and the third data latch 115 shown in FIG. 1. Of these, other circuit blocks than the third data latch 115 are omitted for simplification in FIG. 2.

When a block start signal is supplied to a signal line 103, an address adder 119 in FIG. 2 initializes, in synchronism with a clock signal 102, a linear address held by the address adder 119, to "0". The address adder 119 supplies this linear address to a signal line 121 and supplies a trigger signal to a signal line 152. It is now supposed that the linear address held by the address adder 119 is referred to LADDER(n−1) and that a zero runlength data word on a signal line 113 is referred to RUN(n). In this case, the address adder 119 calculates and holds, in synchronism with the clock signal 102, a new linear address LADDER(n) according to the equation (3) above-mentioned. This new linear address is also supplied to the signal line 121. Further, the address adder 119 has a function of cyclically setting 2-bit information on a signal line 151 to "00", "10", and "01". Upon each reception of an EOB detection signal on a signal line 104, the address adder 119 updates 2-bit information from "00" to "10", from "10" to "01", and from "01" to "00".

A lookup table 122 in FIG. 2 has an address transform table, shown in FIG. 8, corresponding to the zigzag scan in FIG. 8. Thus, the linear address on the signal line 121 is transformed into a corresponding zigzag scan address, which is then supplied to a signal line 123.

The trigger signal on the signal line 152 is supplied to a reading and initializing address generating circuit 159. Upon reception of the trigger signal on the signal line 152, the reading and initializing address generating circuit 159 starts successively supplying a reading and initializing address to a signal line 160.

Figure 3A:
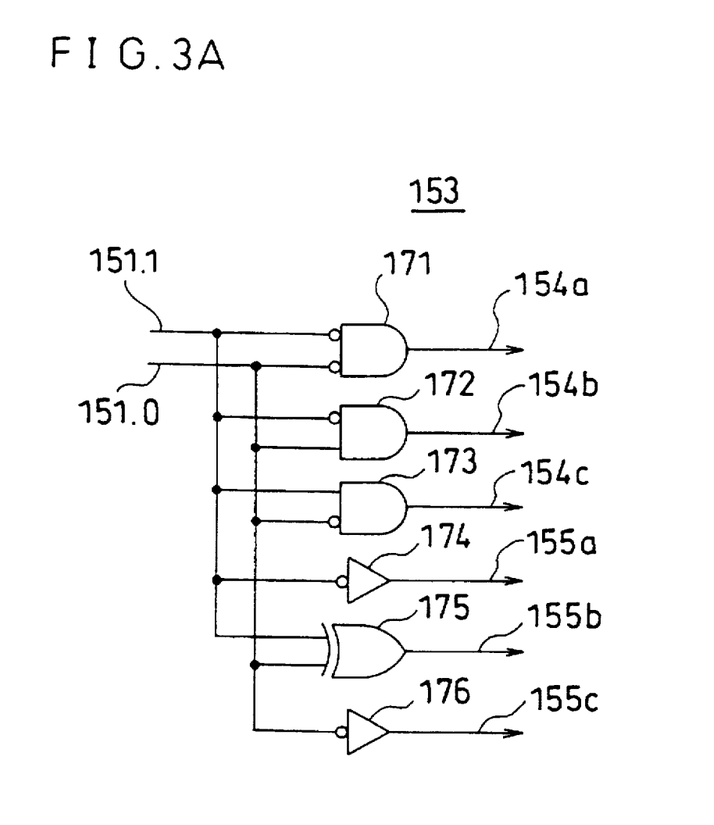
FIG. 3A is a circuit diagram illustrating an example of the inside arrangement of the decoder in FIG. 2.
Figure 3B:
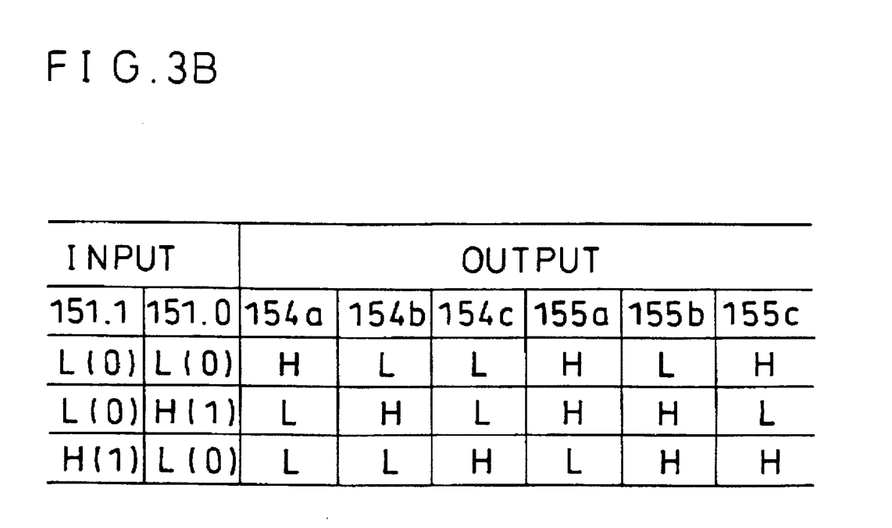
FIG. 3B shows a truth table of the decoder in FIG. 2.

The 2-bit information on the signal line 151 is supplied to a decoder 153. FIG. 3A shows an example of the inside arrangement of the decoder 153. The decoder 153 has: four logic circuit 171, 172, 173, 175 each arranged to receive two inputs of upper and lower bits 151.1 and 151.0 forming 2-bit information on the signal line 151; an inverter 174 for receiving the upper bit 151.1; and an inverter 176 for receiving the lower bit 151.0. The decoder 153 has six output signal lines 154a, 154b, 154c, 155a, 155b, 155c. FIG. 3B shows a truth table of the decoder 153.

Disposed on the periphery of the first, second and third scan transform RAMs 131a, 131b, 131c in FIG. 2 are (i) first, second and third data multiplexers 129a, 129b, 129c, (ii) first, second and third non-inverted control buffers 156a, 156b, 156c, (iii) first, second and third inverted control buffers 158a, 158b, 158c, and (iv) first, second and third address multiplexers 132a, 132b, 132c.

The first data multiplexer 129a supplies, to a signal line 130a, a signed level data word on a signal line 116 when a selection signal on the signal line 154a is in the "H" level, and a fixed data word "0" on a signal line 117 when the selection signal on the signal line 154a is in the "L" level.

The first non-inverted control buffer 156a supplies a data word on the signal line 130a to a signal line 157a when a control signal on the signal line 155a is in the "H" level, and maintains the output of the first non-inverted control buffer 156a itself at high impedance when the control signal on the signal line 155a is in the "L" level. The data word supplied to the signal line 157a is given to the first scan transform RAM 131a. The first inverted control buffer 158a supplies, to a data output terminal 134, the data word read onto the signal line 157a from the first scan transform RAM 131a when the control signal on the signal line 155a is in the "L" level, and maintains the output of the first inverted control buffer 158a itself at high impedance when the control signal on the signal line 155a is in the "H" level. The first address multiplexer 132a supplies, to a signal line 133a, a zigzag scan address on the signal line 123 when the selection signal on the signal line 154a is in the "H" level, and a reading and initializing address on the signal line 160 when the selection signal on the signal line 154a is in the "L" level. The address on the signal line 133a is supplied to the first scan transform RAM 131a. The second data multiplexer 129b, the second non-inverted control buffer 156b, the second inverted control buffer 158b, the second address multiplexer 132b, and signal lines 130b, 133b, 154b, 155b, 157b, are disposed for the second scan transform RAM 131b, and are respectively corresponding to the first data multiplexer 129a, the first non-inverted control buffer 156a, the first inverted control buffer 158a, the first address multiplexer 132a, and the signal lines 130a, 133a, 154a, 155a, 157a. The third data multiplexer 129c, the third non-inverted control buffer 156c, the third inverted control buffer 158c, the third address multiplexer 132c, and signal lines 130c, 133c, 154c, 155c, 157c, are disposed for the third scan transform RAM 131c, and are respectively corresponding to the first data multiplexer 129a, the first non-inverted control buffer 156a, the first inverted control buffer 158a, the first address multiplexer 132a, and the signal lines 130a, 133a, 154a, 155a, 157a.

According to the decoding circuit in FIG. 2, after all the data words stored in the first scan transform RAM 131a have been initialized to "0"s, only the signed level data words are overwritten, according to zero runlength data words, on "0"s at the positions designated by the zigzag scan addresses in the first scan transform RAM 131a. Thus, while only the non-zero components out of 8×8 components forming one block, are written in the first scan transform RAM 131a, there are executed (i) reading a block stored in the second scan transform RAM 131b and (ii) initializing a block stored in the third scan transform RAM 131c. Further, while only the non-zero components of the next block are written in the third scan transform RAM 131c, there are executed (i) reading the block stored in the first scan transform RAM 131a and (ii) initializing the block stored in the second scan transform RAM 31b. Further, while only the non-zero components of the still next block are written in the second scan transform RAM 131b, there are executed (i) reading the block stored in the third scan transform RAM 131c and (ii) initializing the block stored in the first scan transform RAM 131a. Accordingly, likewise the decoding circuit in FIG. 1, the decoding circuit in FIG. 2 can achieve, in real time, highly efficient runlength decoding responsive to a picture element clock signal of high frequency.

It is apparent that similar effects are produced by an arrangement using four or more single-port RAMs. However, two single-port RAMs are enough where, after reading one block is complete, this block is initialized.

The decoding circuit in FIG. 2 may be arranged such that, upon completion of initializing a first block and reading a second block, the reading and initializing address generating circuit 159 supplies a write request signal to the address adder 119, and that, until the address adder 119 receives this write request signal, the address adder 119 waits without updating the 2-bit information on the signal line 151 and gives a wait signal to the VLD 101, even though the address adder 119 has received the EOB detection signal on the signal line 104. According to this arrangement, writing a fourth block never starts before initializing the first block, reading the second block and writing a third block are completed. To increase the speed of reading and initializing blocks in the first, second and third scan transform RAM 131a, 131b, 131c, it is effective, for example, to execute the reading and initialization per a plurality of data words.

What is claimed is:

1. A decoder for decoding a runlength-coded data stream having a plurality of data sets each composed of (i) a zero runlength data word representing the number of zero components preceding a non-zero component, and (ii) a level data word representing a value of said non-zero component, said decoder comprising:

means for latching a given zero runlength data word and a corresponding level data word in said data stream;

memory means for storing each of a series of data words in a predetermined position for scan transform, wherein said memory means comprises two dual-port RAMs (Random Access Memories) arranged such that, while said latched level data word is written in one of said two dual-port RAMs, data words stored in the other dual-port RAM is read and initialized initializing means for initializing all the data words stored in said memory means, to zero data words;

writing means for writing said latched level data word in said memory means such that one of said zero data words in said memory means is overwritten based on said latched zero runlength data word; and reading means for successively reading data words thus stored in said memory means.

2. A decoder according to claim 1, wherein a data word stored in said other dual-port RAM is initialized immediately after read out.

3. A decoder for decoding a runlength-coded data stream having a plurality of data sets each composed of (i) a zero runlength data word representing the number of zero components preceding a non-zero component, and (ii) a level data word representing a value of said non-zero component, said decoder comprising:

means for latching a given zero runlength data word and a corresponding level data word in said data stream;

memory means for storing each of a series of data words in a predetermined position for scan transform, wherein said memory means comprises three single-port RAMs arranged such that, while said latch level data word is written in one of said three single-port RAMs, there are executed (i) reading data words stored in one of the two remaining single-port RAMs and (ii) initializing data word stored in the other of said two remaining single-port RAMs;

initializing means for initializing all the data words stored in said memory means, to zero data words;

writing means for writing said latched level data word in said memory means such that one of said zero data words in said memory means is overwritten based on said latched zero runlength data word; and reading means for successively reading data words thus stored in said memory means.

\* \* \* \* \*

UNITED STATES PATENT AND TRADEMARK OFFICE
CERTIFICATE OF CORRECTION

PATENT NO. : 5,689,254
DATED : November 18, 1997
INVENTOR(S) : FUJIWARA et al.

It is certified that error appears in the above-indentified patent and that said Letters Patent is hereby corrected as shown below:

Col. 10, line 67: After "initialized" insert --;--

Signed and Sealed this

Sixth Day of October, 1998

Attest:

BRUCE LEHMAN

Attesting Officer    Commissioner of Patents and Trademarks